(12) United States Patent
Adriaenssens et al.

(10) Patent No.: US 9,347,834 B2
(45) Date of Patent: May 24, 2016

(54) INFRARED SENSOR ARRAY BASED TEMPERATURE MONITORING SYSTEMS FOR DATA CENTERS AND RELATED METHODS

(71) Applicant: Redwood Systems, Inc., Fremont, CA (US)

(72) Inventors: Luc W. Adriaenssens, Plano, TX (US); Stewart Findlater, Los Gatos, CA (US)

(73) Assignee: Redwood Systems, Inc., Fremont, CA (US)

( * ) Notice: Subject to any disclaimer, the term of this patent is extended or adjusted under 35 U.S.C. 154(b) by 0 days.

(21) Appl. No.: 14/520,563

(22) Filed: Oct. 22, 2014

(65) Prior Publication Data

US 2015/0123562 A1 May 7, 2015

Related U.S. Application Data

(60) Provisional application No. 61/899,402, filed on Nov. 4, 2013.

(51) Int. Cl.
*G01J 5/10* (2006.01)
*H05B 37/02* (2006.01)
(Continued)

(52) U.S. Cl.
CPC .... *G01J 5/10* (2013.01); *G01J 5/04* (2013.01); *G01J 5/089* (2013.01); *H05B 37/0227* (2013.01); *H05K 7/20836* (2013.01); *G01J 2005/0085* (2013.01); *G01J 2005/106* (2013.01)

(58) Field of Classification Search
CPC .............. G01J 5/10; G01J 5/089; G01J 5/04; G01J 2005/0085; G01J 2005/106; H05K 7/20836; H05B 37/0227

USPC .................................. 315/291; 374/124, 121
See application file for complete search history.

(56) References Cited

U.S. PATENT DOCUMENTS

| 5,565,683 | A | * | 10/1996 | Ando | .................... G01S 3/784 250/338.3 |
| 5,729,019 | A | * | 3/1998 | Krafthefer | ................ G01J 1/02 250/349 |

(Continued)

FOREIGN PATENT DOCUMENTS

| JP | 2013-073413 A | 4/2013 |
| KR | 10-2013-0033528 | 4/2013 |

OTHER PUBLICATIONS

"Ten Steps to Increasing Data Center Efficiency and Availability through Infrastructure Monitoring," Emerson Network Power, 2011.
(Continued)

*Primary Examiner* — Lisa Caputo
*Assistant Examiner* — Philip Cotey
(74) *Attorney, Agent, or Firm* — Myers Bigel & Sibley, P.A.

(57) ABSTRACT

Temperature monitoring systems for data centers include a plurality of ceiling-mounted infrared sensor arrays. Each infrared sensor array includes a two-dimensional array of infrared emission sensors, and at least some of the infrared emission sensors have field of view patterns that project onto aisle faces of equipment racks that are mounted in rows in the data center. These systems may further include a controller that is remote from at least some of the infrared sensor arrays and that is in communications with the infrared sensor arrays, the controller configured to provide a two-dimensional thermal map of the aisle faces of the equipment racks based at least in part on temperature data received from the infrared sensor arrays.

18 Claims, 4 Drawing Sheets

(51) Int. Cl.
  *G01J 5/04* (2006.01)
  *H05K 7/20* (2006.01)
  *G01J 5/08* (2006.01)
  *G01J 5/00* (2006.01)

(56) References Cited

U.S. PATENT DOCUMENTS

| | | | |
|---|---|---|---|
| 2008/0281551 A1 | 11/2008 | Hamann et al. | |
| 2009/0017816 A1 | 1/2009 | Chainer et al. | |
| 2011/0279967 A1 | 11/2011 | Claassen et al. | |
| 2012/0052785 A1* | 3/2012 | Nagamatsu | H05K 7/20836 454/184 |
| 2013/0081034 A1* | 3/2013 | Shimizu | G06F 1/206 718/102 |
| 2014/0112537 A1* | 4/2014 | Frank | H04N 5/33 382/103 |
| 2014/0334519 A1* | 11/2014 | Antonini | G01K 1/143 374/124 |

OTHER PUBLICATIONS

Stockton, Gregory R., "Using Thermal Mapping at the Data Center," Stockton Infrared Thermographic Services, www.stocktoninfrared.com/using-thermal-mapping-at-the-data-center/, accessed Oct. 15, 2013.

"Vigilent Broadens Reach of Dynamic Cooling Management Control from Data Centers to Technical and Administrative Offices: Single-System, Thermal Control Generates Dramatic Energy Savings in changing, Mixed-Use Building Portfolios," www.vigilent.com/vigilent-broadens-reach-dynamic-cooling-management-control-d . . . , May 12, 2014.

Product Brochure, MLX90620—16x4 IR Array, Melexis, 3001090620, Rev. 4, Sep. 19, 2012.

Passive Infrared Sensor, Wikipedia, The Free Encyclopedia, Wikimedia Foundation, Inc. Jul. 22, 2004. Web. Sep. 11, 2014.

Notification of Transmittal of the International Search Report and the Written Opinion of the International Searching Authority, or the Declaration, PCT/US2014/062155, Jan. 20, 2015, 15 pages.

\* cited by examiner

FIG. 6

INFRARED SENSOR ARRAY BASED TEMPERATURE MONITORING SYSTEMS FOR DATA CENTERS AND RELATED METHODS

CROSS-REFERENCE TO RELATED APPLICATION

The present application claims priority to U.S. Provisional Patent Application Ser. No. 61/899,402, filed Nov. 4, 2013, the entire content of which is incorporated herein by reference as if set forth in its entirety.

FIELD OF THE INVENTION

The present invention relates to data centers and, more particularly, to monitoring the temperature of equipment in data centers.

BACKGROUND

As the cost of computing power continues to decrease, an increasing number of users deploy ever more sophisticated applications on ever more capable computing devices. Many applications are implemented most efficiently on specialized equipment such as servers which are capable of processing and responding to requests from many users simultaneously (e.g., requests for web pages, etc.). Often these servers and associated equipment such as switching, routing, patching and data storage systems and telecommunications equipment are operated in large facilities referred to as "data centers." Commercial data centers include Internet data centers, which are typically operated by Internet service providers, enterprise data centers, which are operated by corporations to support their businesses, and so-called co-location data centers that are run by companies that support data center operations for other entities. As it can be critically important to businesses that these computing operations are available and properly functioning twenty-four hours a day, seven days a week, most data centers employ extensive redundancy and take other precautions to minimize the possibility that various systems in the data center malfunction and/or become unavailable.

In a typical data center, the servers and other computer equipment are mounted in cabinets and racks that may comply with industry standardized design specifications. Herein, these cabinets and racks are generically referred to as "equipment racks," and it will be understood that the term "equipment racks" as used herein encompasses both open-frame racks and racks/cabinets having sidewalls, back walls, doors and the like. The equipment racks are typically aligned in rows with aisles running therebetween. Conventionally, a single row of equipment racks is provided between two adjacent aisles in order to allow technicians convenient access to both the front side and the back side of each equipment rack, which may make it easier for the technicians to make patching changes, swap out equipment, plug in power cords, perform repairs and the like. This configuration may facilitate maintaining the temperature within the data center within desired ranges using a conventional hot aisle/cold aisle arrangement that is discussed in more detail below. A side of an equipment rack such as the front side or the back side that faces an aisle is referred to herein as an "aisle face" of the equipment rack. Data centers also typically have raised floors, and cabling that connects the computer equipment may be routed through conduits provided under the raised floors and/or in overhead cabling trays.

Another factor of great importance in data centers is to minimize operational cost, including energy consumption. As data centers continue to grow, their energy consumption is becoming an ever more scrutinized parameter. Metrics have been developed to measure the energy efficiency of data centers. One very common metric is referred to as Power Usage Effectiveness ("PUE"). This measure is the ratio of power delivered to the data center divided by the power delivered to the electronic equipment such as servers, storage equipment and network equipment. The closer to 1.0 the PUE, the better. According to the Uptime Institute, the average PUE was 2.5 in 2007 but, based on significant effort by the industry is down to 1.65 in mid-2013. There is great interest in further reduction in the energy consumption of data centers.

Data centers also typically include extensive electrical power distribution and cooling systems. The electronic equipment in a data center can produce large amounts of heat, and care must be taken to ensure that each item of electronic equipment is operated within its specified operating temperature ranges. Extensive design work may be performed in an effort to ensure that data centers maintain the electronic equipment within the specified operating temperature ranges.

SUMMARY

Pursuant to embodiments of the present invention, temperature monitoring systems for data centers are provided that include a plurality of aisles and a plurality of equipment racks that are mounted in rows between the aisles. These temperature monitoring systems may include a plurality of ceiling-mounted infrared sensor arrays, where each infrared sensor array includes a two-dimensional array of infrared emission sensors, and at least some of the infrared emission sensors have field of view patterns that project onto aisle faces of the equipment racks. These systems may further include a controller that is remote from at least some of the infrared sensor arrays and that is in communications with the infrared sensor arrays, the controller configured to provide a two-dimensional thermal map of the aisle faces of the equipment racks based at least in part on temperature data received from the infrared sensor arrays.

In some embodiments, a first of the infrared sensor arrays may comprise a substrate that has the plurality of infrared emission sensors on a front surface of the substrate. A back surface of the substrate may be mounted at an acute angle with respect to a plane defined by the floor of the data center. The acute angle may be at least twenty degrees in some embodiments.

In some embodiments, a first of the ceiling-mounted infrared sensor arrays may be mounted on a support that extends downwardly below the ceiling.

In some embodiments, the ceiling-mounted infrared sensor arrays may be co-located with light fixtures that are mounted above the aisles. In such embodiments, the controller may be configured to control light emitted by the light fixtures based at least in part on motion detected by the ceiling-mounted infrared sensor arrays.

In some embodiments, a first of the infrared sensor arrays may be powered via a cable that includes at least first and second conductors, and the information received from the first of the infrared sensor arrays may be transmitted to the controller over at least one of the first and second conductors. The first and second conductors of the cable may also provide a direct current power signal to a light fixture.

In some embodiments, a first infrared emission sensor of a first of the infrared sensor arrays may have a field of view pattern that projects onto an upper portion of the aisle face of a first equipment rack and a second infrared emission sensor of the first of the infrared sensor arrays may have a field of view pattern that projects onto a lower portion of the aisle face of the first equipment rack. A third infrared emission sensor of the first of the infrared sensor arrays may have a field of view pattern that projects onto a top surface of the first equipment rack, and/or a fourth infrared emission sensor of the first of the infrared sensor arrays may have a field of view pattern that projects onto a floor of the data center.

In some embodiments, the infrared sensor arrays may be Grid Pattern Infrared sensor arrays that detect infrared emissions and convert the detected infrared emissions to temperature values.

In some embodiments, the field of view pattern of the infrared emission sensors of a first of the ceiling-mounted infrared sensor arrays may have respective resolutions that vary at least as a function of a height of the field of view pattern above a floor of the data center. For example, the respective resolutions may increase with increasing height of the field of view pattern above the floor.

Pursuant to embodiments of the present invention, methods of monitoring temperatures at a plurality of equipment rack mounted electronic devices in a data center are provided in which a plurality of infrared sensor arrays that each include a plurality of ceiling-mounted infrared emission sensors are mounted so that the infrared emission sensors project multiple rows of field of view patterns that are at different heights above a floor of the data center on the aisle faces of the equipment racks. The infrared sensor arrays are used to determine temperature readings at the aisle faces of the equipment racks at different heights above the floor of the data center. These temperature readings are transmitted to a centralized controller and temperature information may then be output to a user.

In some embodiments of these methods, a multi-dimensional thermal map of the aisle faces of the equipment racks may be compiled based on the temperature readings.

In some embodiments, the temperature readings taken at greater heights above the floor of the data center may have greater resolution than temperature readings taken at smaller heights above the floor of the data center.

In some embodiments, these methods may also include performing a commissioning process for each of the infrared sensor arrays in which an average emissivity for each field of view pattern is determined. This commissioning process may further include determining a contribution of reflected light from one or more light fixtures to the infrared readings for each infrared emission sensor.

Pursuant to embodiments of the present invention, integrated lighting and thermal monitoring systems for data centers are provided that include a central controller, a solid state light fixture, at least one infrared sensor array that is co-located with the solid state light fixture, and a cable that has first and second conductors that is configured to supply power to the solid state light fixture and to the infrared sensor array. The infrared sensor array includes a plurality of infrared emission sensors that are configured to take temperature readings along the aisle face of a row of equipment racks, where the temperature readings are taken at different heights above a floor of the data center. In some embodiments, at least one of the first and second conductors may be configured to provide a transmission medium for transmitting temperature data from the infrared sensor array to the central controller. In other embodiments, the infrared sensor array may be configured to wirelessly transmit temperature data to the central controller.

BRIEF DESCRIPTION OF THE DRAWINGS

FIG. 6 is a schematic view of a two-dimensional temperature map that may be output by the temperature monitoring systems according to embodiments of the present invention that shows real-time temperature readings along a row of equipment racks in a data center.

DETAILED DESCRIPTION

In commercial data center operations, one of the biggest uses of energy beyond the energy used to power the computing equipment is the energy used to power air conditioning units that are used to cool the air provided to the computing equipment to a suitable temperature to prevent overheating. Having the temperature at the air intake ports of the computing equipment be consistent is desirable in most cases. The most common approach for achieving such temperature consistency is to arrange the computing equipment in equipment racks so that the computing equipment is configured in an alternating hot-aisle/cold-aisle arrangement.

Figure 1:
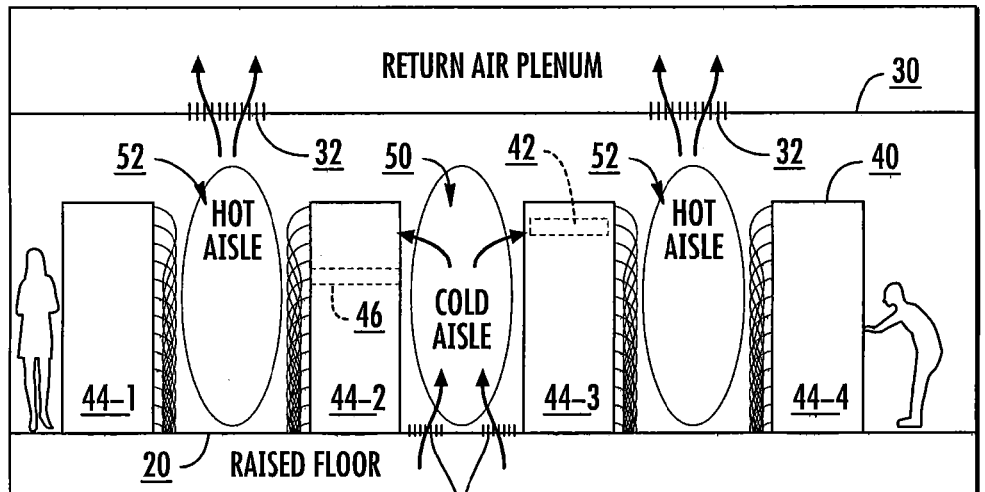
FIG. 1 is a schematic side view of several aisles of a data center that illustrates a conventional hot-aisle/cold-aisle equipment rack arrangement.

In particular, FIG. 1 is a schematic side view of a portion of a data center that illustrates a conventional hot-aisle/cold-aisle arrangement. As shown in FIG. 1, a typical data center 10 may include a raised floor 20 and a ceiling 30. In some cases, the ceiling 30 may be a drop-down ceiling, while in other cases the ceiling may be a standard ceiling. A plurality of equipment racks 40 are provided that may be arranged in a side-by-side fashion to form a plurality of rows 44 of equipment racks 40. Four such rows 44 are shown in FIG. 1. Each equipment rack 40 may have a plurality of vertically disposed slots 46, and servers, routers, switches or other computing equipment 42 may be mounted in these slots 46. In FIG. 1, the slots 46 and computing equipment 42 are not visible due to the sidewalls on the equipment racks 40, but an example slot 46 and an example item of computing equipment 42 are shown using broken lines in FIG. 1 for illustrative purposes. Aisles 50, 52 are provided between the rows 44 to allow technicians access to the front and back sides of the equipment racks 40. In FIG. 1, the rows 44 are designated as rows 44-1 through 44-4 to facilitate descriptions herein that focused on a particular row (e.g., row 44-1). This same numbering convention will also be used with respect to certain other elements in the drawings (e.g., a specific hot aisle 52 may be labeled as hot aisle 52-1 for ease of description).

The electronics in an item of computing equipment 42 such as a server may generate substantial amounts of heat when the electronic device 42 is in use. Typically, each electronic device 42 will have an air intake port on a first side of the device (typically the front side) and an exhaust port that is located on the other side of the device 42. Fans on the device 42 suck in air through the air intake port which is used to cool the integrated circuits and other components within the device, and the heated air is then expelled through the exhaust port. Preferably, the air intake port will suck in relatively cool air. The degree that the air is warmed as the air passes through a device 42 is a function of the heat load generated by the device 42, which may depend on, among other things, the type of device used and the processing load placed on the device 42.

The electronic equipment 42 is typically mounted in the equipment racks 40 so that all of the air intake ports on the devices 42 in a particular row 44 will face a first aisle (namely a "cold aisle" 50), while all of the exhaust ports on the devices in the row 44 will face a second aisle (namely a "hot aisle" 52). Perforated floor tiles 22 may be provided in, for example, the floor 20 of the cold aisles 50. Cold air from air conditioning units may be pumped into each cold' aisle 50 to help ensure that cold air is sucked into the air intake ports on each item of electronic equipment 42. Return air vents 32 are provided in the ceiling 30 or otherwise positioned above the hot aisles 52 and are used to vent the hot air that is exhausted from the electronic equipment 42 to outside the data center 10 or to return the hot air to air conditioning units for re-cooling. This arrangement may help reduce air conditioning related energy costs and help ensure that the electronic equipment 42 is operated within specified temperature ranges. While the operating ranges may vary for different types of electronic equipment, typical preferred temperatures at the air inlet port are, for example, 61-75° F.

Ideally, the pressure of the cold air being pushed into each cold aisle 50 through the perforated tiles 22 in the raised floor 20 is just enough to provide adequate cold air for all of the devices 42 mounted in the equipment racks 40 on both sides of the aisle 50. However, in practice, it may be difficult to achieve just the right level of air pressure. If too much pressure is provided to the cold air pumped into one of the cold aisles 50, a portion of the cold air may spill-over into the adjacent hot aisles 52. This spill-over of cold air into the hot aisles 52 is wasteful and results in lower PUE. If too little pressure is provided in the cold aisle 50, warm air from the hot aisles 52 can spill over the top of the equipment racks 40 and be sucked into the equipment 42 through the air intake ports. This can cause the equipment 42 to operate less efficiently or, worse yet, too overheat and malfunction.

An additional complexity is that modern data centers are very dynamic. As user demand on the electronic equipment 42 changes, the heat load generated by the equipment 42 likewise changes. Demand may vary for a wide variety of reasons including, for example, time of day, programming, promotions, time of season, etc. The electronic equipment 42 may attempt to correct for changes in the heat load that result from variations in demand by altering the speed of the internal cooling fans that are provided in the electronic devices 42. Specifically, if the internal temperature of a server 42 increases, the server 42 may automatically increase the speed of its cooling fans in response. The temperature at the air intake ports of servers and other electronic equipment 42 that are mounted in the bottom slots of an equipment rack 40 is often very predictable, as it may be closely and deterministically related to the temperature of the cold air output by the air conditioning unit through the perforated tiles 22 in the raised floor 20.

When servers and other electronic equipment 42 that are located in the lower positions in the equipment racks 40 increase their fan speed in response to, for example, an increased processing load, the air pressure in the cold aisles 50 may decrease and a corresponding increase may occur in the air pressure in the hot aisles 52. These pressure changes in turn result in greater spill-over of hot air from the hot aisles 52 into the cold aisles 50. As a result of this spillover, the air sucked into the air intake ports of the electronic equipment 42 is increased, particularly with respect to devices 42 that are located in the top portions of the equipment racks 40. The fan speeds of the electronic devices 42 in these locations will then be increased in an effort to compensate for the hot air spilling over into the cold aisles 50, but this results in an even greater air pressure differential and hence even more spill-over of hot air into the cold aisles 50. Because of this feedback effect, it may be difficult to feed sufficient cold air to the electronic devices 42 in the top slots in the equipment racks 40, which may cause the electronic devices 42 in these rack positions to operate outside of a desired operating temperature. It should be noted that some data centers may have top-to-bottom airflow with the cold air entering above the aisles (e.g., from vents in the ceiling or in ducts located above the aisles) and the hot air exiting through the floor. The temperature monitoring systems according to embodiments of the present invention that are discussed below may be used in either type of data center, as well as data centers having other air flow schemes.

For the reasons discussed above, it may be difficult to maintain the temperature at the air intake ports of the electronic devices 42 at a relatively uniform level from the bottom to the top of the equipment racks 40. In order to reduce energy usage, a data center manager may intentionally allow the temperature at the air intake ports of electronic devices 42 in the top slots 46 in the equipment racks 40 to approach the maximum allowable level in order to minimize the air conditioning expense, but at the same time the data center manager will need to be careful to avoid allowing the temperatures to exceed the specified levels which may cause equipment failures. The Uptime Institute notes that failure rate for electronic equipment 42 that is mounted in the top third of the slots 46 in equipment racks 40 is three times the failure rate of electronic equipment 42 that is mounted in the slots 46 in the lower two-thirds of the equipment racks 40. Consequently, having accurate and reliable data regarding the temperatures at the air intake ports of the electronic devices 42, especially the devices 42 in the top slots 46 of the equipment racks 40, may be desirable in order to make more informed decisions to minimize energy consumption without compromising reliability and/or damaging the electronic equipment 42.

In many data center installations, temperature sensors may be installed at various locations on the equipment racks 40. These temperature sensors communicate temperature readings to a central location for monitoring and analysis. Such temperature monitoring systems are currently on the market from companies such as Vigilent (www.vigilent.com). One disadvantage of such systems is that the temperature sensors are typically mounted in front of the equipment 42 and hence must be moved out of the way when maintenance is performed on the electronic equipment 42. Another disadvantage is the high installed cost of such a system. One compromise is to place the temperature sensors on only selected equipment racks 40 and to then assume that the other equipment racks 40 will perform in a similar fashion. However, since heat load can vary significantly between equipment racks 40, this is a significant compromise.

Pursuant to embodiments of the present invention, lower cost approaches are provided for obtaining accurate temperature data at the air intake ports on electronic equipment 42 that is mounted in equipment racks 40 in a data center. This temperature data is collected via remote sensors that then transmit the collected temperature data to a central controller for monitoring and analysis. In particular, ceiling-mounted infrared sensor arrays may be provided, for example, in spaced-apart locations along the cold aisles 50 in a data center 10. These infrared sensor arrays may be configured to measure the temperature along the aisle faces of the equipment racks 40 that face the cold aisles (and perhaps the hot aisles as well). The measured temperature data may then be communicated over wired or wireless communication links to the centralized controller where the data can, for example, be used to generate a map of the temperatures at the air intake ports of the electronic equipment 42 throughout the data center 10.

In some embodiments, the infrared sensor arrays may be positioned at an angle so that they point more directly toward the aisle faces of the equipment racks 40. The infrared sensor arrays may also be mounted on supports that extend downwardly from the ceiling 30 so that the sensors may be located closer to the aisle faces of the equipment racks 40 and at more favorable angles. Moreover, the infrared sensor arrays may, in some embodiments, be co-located with light fixtures that are mounted in the ceiling 30 of the data center 10. In such embodiments, the infrared sensor arrays and the light fixtures may be powered via a common cable and/or may transmit and/or receive communications over a common cable. In some embodiments, a single cable may be used to deliver a direct current electrical power signal that is used to power both an infrared sensor array and a light fixture, and the same cable may also be used by the infrared sensor array to communicate the measured temperature data to the centralized controller. In some embodiments, the direct current may not be continuous but may instead be modulated using pulse-code-modulation or similar methods ("interrupted direct current power") to enable, for example, dimming.

In some embodiments, the infrared sensor arrays may comprise Grid Pattern Infrared ("GPIR") sensor arrays. GPIR sensor arrays refer to a new class of infrared sensor products that have become available in recent years that comprise a two-dimensional array (or "grid") of sensors, where each sensor may have much narrower field of view cone (or other shaped pattern) than infrared sensors used in traditional applications such as motion detection. Two examples of GPIR sensors are Panasonic's 8×8 Grid-Eye sensor array (part # AMG8831) and Melexis' 16×4 sensor array (part # MLX90620). The infrared sensors in these arrays may include a lensing system (e.g., a low cost Fresnel lens) that focuses infrared energy from a specific field of view (i.e., a cone) onto a chip where the energy is absorbed. The field of view cone for each sensor in the Panasonic product is about 8 degrees, while the field of view cone for each sensor in the Melexis product is between 2.6 degrees and 4.1 degrees, depending on the type of lens used. The sensors in these products may be arranged in a wide variety of grid array patterns such as, for example, rectangular grids, circular grids, etc. Any appropriate number of sensors may be included in the array.

The infrared emission sensors in the infrared sensor arrays may record infrared emission readings. For example, each infrared emission sensor may continuously detect the total infrared emission within its field of view pattern. The detected infrared emission value may be represented, for example, as a voltage or current value that is output by the infrared emission sensor, or as a digital representation of temperature. The field of view patterns of the infrared emission sensors in the infrared sensor array will typically point in different directions so that a single infrared sensor array may monitor the infrared emissions over a relatively wide area. The field of view patterns of the individual infrared emission sensors within the infrared sensor array may or may not be designed to partially overlap.

The infrared emission readings that are obtained from each infrared emission sensor may be converted to temperature readings by circuitry associated with the infrared sensor array. In particular, all objects having a temperature above absolute zero (−273° C.) emit infrared radiation. The level of infrared radiation emitted by an object is a function of the temperature of the object and the emissivity of its outer surface. Consequently, if the entire field of view pattern of an infrared emission sensor illuminates the same material and the emissivity of the material is known, the resulting sensor reading can be converted into an associated temperature with great accuracy. The emissivity of the various materials that are illuminated by the infrared emission sensors of the infrared sensor arrays are either known (e.g., black oil-based paint has an emissivity of about 0.94, and is the most common surface covering used in data centers) or can be estimated or measured as part of a commissioning process for the infrared sensor arrays. Known or measured emissivity values thus may be obtained and stored in an infrared sensor array for each of the infrared emission sensors thereof based on the material(s) within the field of view patterns of the sensors. The infrared sensor array may then compute weighted averages to determine temperature values corresponding to each infrared emission sensor.

The commissioning process may also take into account the degree to which the field of view pattern of each sensor picks up reflected light from the light fixtures in the data center if light fixtures emit infrared emissions at frequencies within the frequency band of sensitivity of the sensors. Thus, the impact of fixed lighting sources on the temperature readings may be taken into account in advance through the commissioning process. Other non-fixed light sources such as direct sunlight that may illuminate objects in the field of view patterns of the infrared emission sensors may corrupt the temperature readings (i.e., yielding higher temperatures than the actual temperature), since sunlight is a variable light source that cannot be accounted for in advance. However, data centers typically block direct sunlight to better protect the equipment and thus excessive corruption from direct sunlight or other variable light sources is unlikely in most applications.

The infrared sensor array may output the temperature reading (or data that may be converted to a temperature reading) from each infrared emission sensor. These temperature readings may be transmitted to a central controller. A single, centralized controller may be provided for a data center or a portion thereof, and this controller may process the temperature data that it receives from all of the infrared sensor arrays deployed in the data center (or the portion thereof) and/or may format the temperature data in useful ways (e.g., by creating two-dimensional or three-dimensional thermal maps of the data center).

Data centers often are built to standard design specifications that are carefully chosen to accommodate the equipment and facilitate efficient data center operation. This standardized design may also facilitate lower cost implementation of the temperature monitoring systems according to embodiments of the present invention. For example, data centers typically use standard 2'×2' (or 60 cm×60 cm) floor tiles to implement the raised floor 20. The aisles 50, 52 are typically two tiles (four feet) wide. Light fixtures are often centered over the aisles 50, 52 to maximize visibility of the equipment, and each light fixture is typically designed to illuminate a 4'×12' area (i.e., a twelve foot section along the length of an aisle), although other areas such as 4'×8' are also often used. The equipment racks 40 are typically in the range of six to seven feet tall and two feet wide, and the ceiling 30 is typically at a height of about nine or 9.5 feet above the raised floor 20.

Because the design is standardized, the infrared sensor arrays may be configured the same way and mounted in the same locations along each aisle 50, 52. This can greatly simplify installation and commissioning of the temperature monitoring systems according to embodiments of the present invention.

Embodiments of the present invention will now be discussed in greater detail with reference to FIGS. 2-8.

Figure 2:
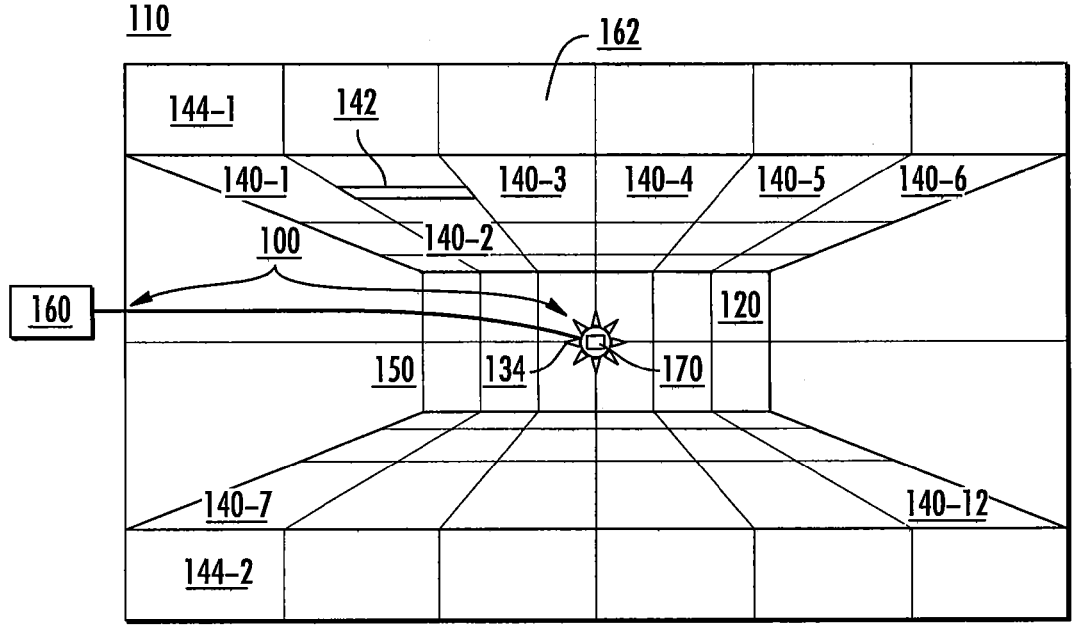
FIG. 2 is a schematic plan view of an aisle in a data center for which temperature monitoring may be performed using the temperature monitoring systems according to embodiments of the present invention.

FIG. 2 is a schematic plan view of a cold aisle 150 in a data center 110. Twelve equipment racks 140 (six per side) are aligned in rows 144-1, 144-2 on either side of the cold aisle 150. Electronic equipment 142 such as servers are mounted in the equipment racks 140. While a single such device 142 is schematically depicted in FIG. 2, it will be appreciated that typically each equipment rack 140 will include many such devices (e.g., 42 or 47 devices 142 per equipment rack 140). The cold aisle 150 in this example is four feet wide, and each equipment rack 140 is six feet high and two feet wide. For illustrative purposes, the equipment racks 140 are divided vertically into a bottom third, a middle third and a top third. The ceiling (not shown) is at a height of 9.5 feet above the floor 120 or 3.5 feet above the top of the equipment racks 140.

As is also shown in FIG. 2, a temperature monitoring system 100 is also provided that includes a ceiling-mounted infrared sensor array 170 that is mounted overhead above the aisle 150 and a central controller 160. Herein, the term "ceiling-mounted infrared sensor array" refers to an infrared sensor array that is mounted in or on the ceiling or on a structure such as a light fixture, mounting post or the like that is mounted to or hangs down from the ceiling. The ceiling may comprise a single ceiling or a multi-level ceiling (e.g., a ceiling comprising an upper ceiling and a lower ceiling in the form of drop-down ceiling tiles that hang below the upper ceiling). In some embodiments, the infrared sensor array 170 may be mounted on or near a ceiling mounted light fixture 134. In the depicted embodiment, the infrared sensor array 170 is mounted above the center of the aisle 150, halfway along the length of the twelve foot aisle 150. It will be appreciated that the infrared sensor arrays 170 may not always be located above the exact center of an aisle. However, the light fixtures 134 in data centers tend to be deliberately aligned with the aisles as part of the data center design, and hence the light fixtures 134 will typically be positioned to be approximately in the center of the width of each aisle. As noted above, in some embodiments, the infrared sensor arrays 170 may be co-located with the light fixtures 134, and hence also located in the approximate center of their respective aisles.

Figure 3:
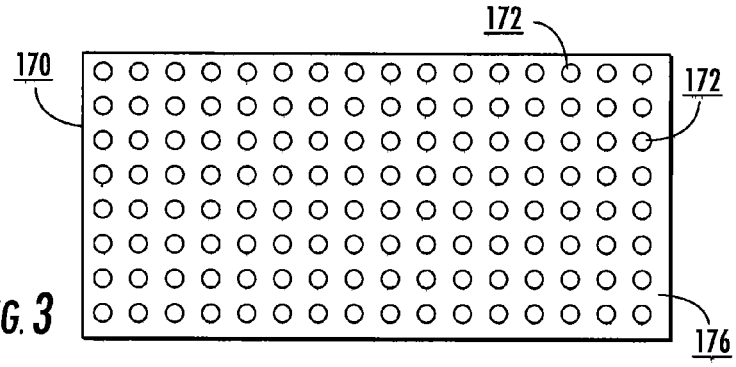
FIG. 3 is a schematic plan view of a 16×8 infrared sensor array that may be used in the temperature monitoring systems according to embodiments of the present invention.

The infrared sensor array 170 in the depicted embodiment is a 16×8 grid pattern infrared sensor array 170 (see FIG. 3) that includes 128 infrared emission sensors 172. It will be appreciated that the 16×8 grid pattern infrared sensor array 170 that is shown in the embodiment of FIGS. 2-3 is for illustrative purposes only. Different two-dimensional grid arrangements including rectangular, circular or other arrangements may be deployed, and any appropriate number of infrared emission sensors 172 may be included in the infrared sensor array 170. It will also be appreciated that the spacing between adjacent field of view patterns does not have to be uniform.

Still referring to FIG. 2, the central controller 160 may be in communication with the infrared sensor array 170. In particular, the infrared sensor array 170 may communicate an estimated temperature for each of its infrared emission sensors 172 to the centralized controller 160. This information may, for example, comprise two bytes (16 bits) of information, although a single byte could be used in some embodiments. Assuming two bytes of information per infrared emission sensor 172, an infrared sensor array 170 that includes 128 sensors 172 (e.g., a 16×8 grid) would transmit 256 bytes (2048 bits) of information to the centralized controller 160 each time it transmitted updated temperature data. If temperature data for each infrared emission sensor 172 is transmitted once every eight seconds, then a communications capacity of 256 bits per second would be required (at a minimum) between each infrared sensor array 170 and the centralized controller 160. In practice, some bits and/or control symbols are transmitted in addition to the desired data as part of the networking protocol. In the depicted embodiment, a communications cable 162 having first and second conductors may be used to carry communications between the infrared sensor array 170 and the central controller 160. In other embodiments, wireless connections may be used.

While the infrared sensor array 170 is depicted above a cold aisle 150 in FIG. 2, it will be appreciated that the infrared sensor arrays 170 may also be mounted above the hot aisles 152 (see FIG. 7) and/or above the equipment racks 140.

FIG. 3 is a schematic plan view of a 16×8 infrared sensor array 170 that may be used in the temperature monitoring systems according to embodiments of the present invention. As shown in FIG. 3, the infrared sensor array 170 comprises a substrate 176 having one hundred and twenty eight infrared emission sensors 172 mounted on a front side thereof that are arranged in eight rows having sixteen infrared emission sensors 172 in each row.

Figure 4:
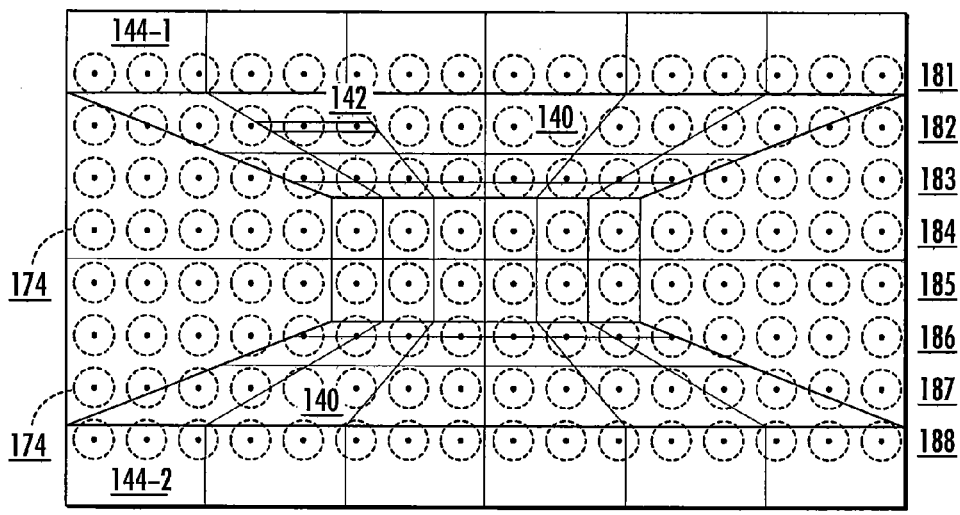
FIG. 4 is a schematic plan view of the aisle of FIG. 2 illustrating the field of view patterns of the infrared sensor array of FIG. 3 along the aisle when the infrared sensor array is mounted above the aisle.
Figure 5:
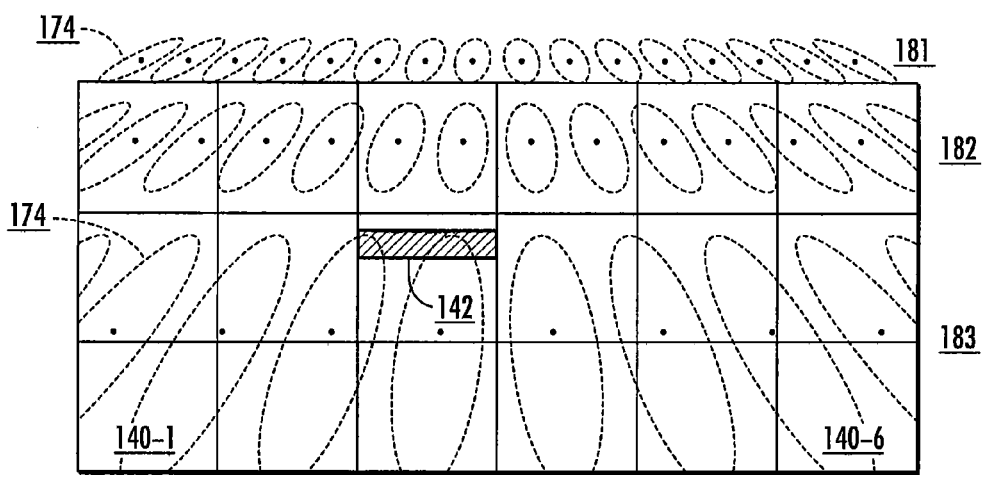
FIG. 5 is a schematic front view of the equipment racks on one side of the aisle of FIGS. 2 and 4 illustrating the shapes of the field of view patterns of FIG. 4 as projected onto the aisle faces of the equipment racks on one side of the aisle.

FIG. 4 is a schematic plan view of the cold aisle 150 of data center 110 that is depicted in FIG. 2, with the field of view patterns 174 for the infrared emission sensors 172 of infrared sensor array 170 illustrated thereon. In particular, the dashed circles 174 in FIG. 4 represent the field of view cone for each infrared emission sensor 172, showing where the field of view cone 174 projects onto the floor 120 or equipment racks 140. In the example embodiment depicted in FIG. 4, the infrared sensor array 170 is mounted to face downwardly. The field of view pattern 174 for each infrared emission sensor 172 in the infrared sensor array 170 is assumed to have a circular pattern (although, as shown in FIG. 5, infra, each the circular field of view pattern 174 will project as an ellipse onto the equipment racks 140 since the infrared emission sensors 172 point toward the equipment racks 140 at an angle). The field of view pattern 174 for each infrared emission sensor 172 is 75% of the spacing between the centers of adjacent field of view patterns 174 (and hence the field of view patterns 174 do not overlap in this case). As is readily apparent from FIG. 4, since the infrared sensor array 170 is spaced above the equipment racks 140 by some distance, the field of view patterns 174 for the infrared emission sensors 172 thereof may cover not only the floor 120 of the aisle 150, but also the aisle faces of the equipment racks 140 (and the electronic equipment 142 mounted therein), and the top surfaces of the equipment racks 140.

As shown in FIG. 4, the first row of sixteen infrared emission sensors 172 (row 181) may be used to detect the temperature at the top of equipment racks 140-1 through 140-6

(i.e., the equipment racks 140 on a first side of aisle 150). The second row of sixteen infrared emission sensors 172 (row 182) detects the temperatures along the aisle face of the top ⅓rd of each of the equipment racks 140. The third row of sixteen infrared emission sensors 172 (row 183) detects the temperatures along the aisle face of the remainder (i.e., the lower two thirds) of each of the equipment racks 140. The fourth row of sixteen infrared emission sensors 172 (row 184) detects the temperatures along the floor 120 of the data center 110 where the cold air enters through perforated tiles. The fifth through eight rows 185-188 perform the same function for the other side of the aisle 150.

If the location L(x,y,z) of the infrared sensor array 170 which will be defined in this example as L(0 ft, 0 ft, 9.5 ft) and the pointing vector of each infrared emission sensor 172 in the infrared sensor array 170 are known, and if the location $O_m(x2,y2,z2)$ of the front surface of each item of electronic equipment $(O_m)$ in the data center 110 is also known, then the field of view patterns 174 (which represent the area for which temperature readings are taken) for each infrared emission sensor 172 in the infrared sensor array 170 can be transformed or mapped from the plane defined by the top surface of the twelve equipment racks 140 (which will be referred to herein as the x-y plane at z=6 ft) onto the vertical plane defined by the aisle face of the equipment racks 140 (which is the x-z plane at y=2 ft). In practice the matrix translation for the field of view patterns 174 of the infrared emission sensors 172 in an infrared sensor array 170 may be rather complex, but can easily be performed using, for example, modern computing equipment. FIG. 5 is a schematic front view of the six equipment racks 140 that define one side of the aisle 150 of FIGS. 2 and 4, and shows the results of the translation of the field of view patterns 174 for the infrared emission sensors 172 onto the plane representing the aisle face of the equipment racks 140-1 through 140-6 (i.e. the x-z plane at y=2 ft). The top row 181 of field of view patterns 174 is also included in the translation for completeness, although the equipment racks 140 do not extend to that height.

As shown in FIG. 5, the side-to-side spacing and top-to-bottom length of the field of view patterns 174 of the infrared emission sensors 172 in the second row (row 182) are smaller than the respective side-to-side spacing and top-to-bottom length of the field of view patterns 174 of the infrared emission sensors 172 in the third row (row 183). As such, all else being equal, the temperature readings in the second row 182 will be more accurate than the temperature readings in the third row 183. This is a desirable characteristic since accurate temperature monitoring is of greatest interest in the top ⅓rd of the equipment racks 140. As noted previously, statistics from the Uptime Institute conclude that the failure rate for electronic equipment 142 in the top ⅓rd of an equipment rack 140 is three times that of the electronic equipment 142 in the remaining ⅔rd of the equipment rack 140. It will also be appreciated that the temperature monitoring systems according to embodiments of the present invention may provide infrared emission readings (and corresponding temperature readings) that have variable resolution as a function of, for example, height above the floor of the data center 110, as the field of view patterns 174 for the infrared emission sensors 172 that project onto the upper portion of the aisle faces of the equipment racks 140 are smaller than the field of view patterns 174 for infrared emission sensors 172 that project onto lower portions of the aisle faces of the equipment racks 140. As shown in FIG. 5, this feature of the temperature monitoring systems according to some embodiments of the present invention may allow for more precise temperature monitoring at different locations on an equipment rack 140 so that, for example, more precise temperature measurements may be obtained at the upper portion of the aisle face of the equipment racks 140, which is generally the area of greatest interest.

Figure 6:
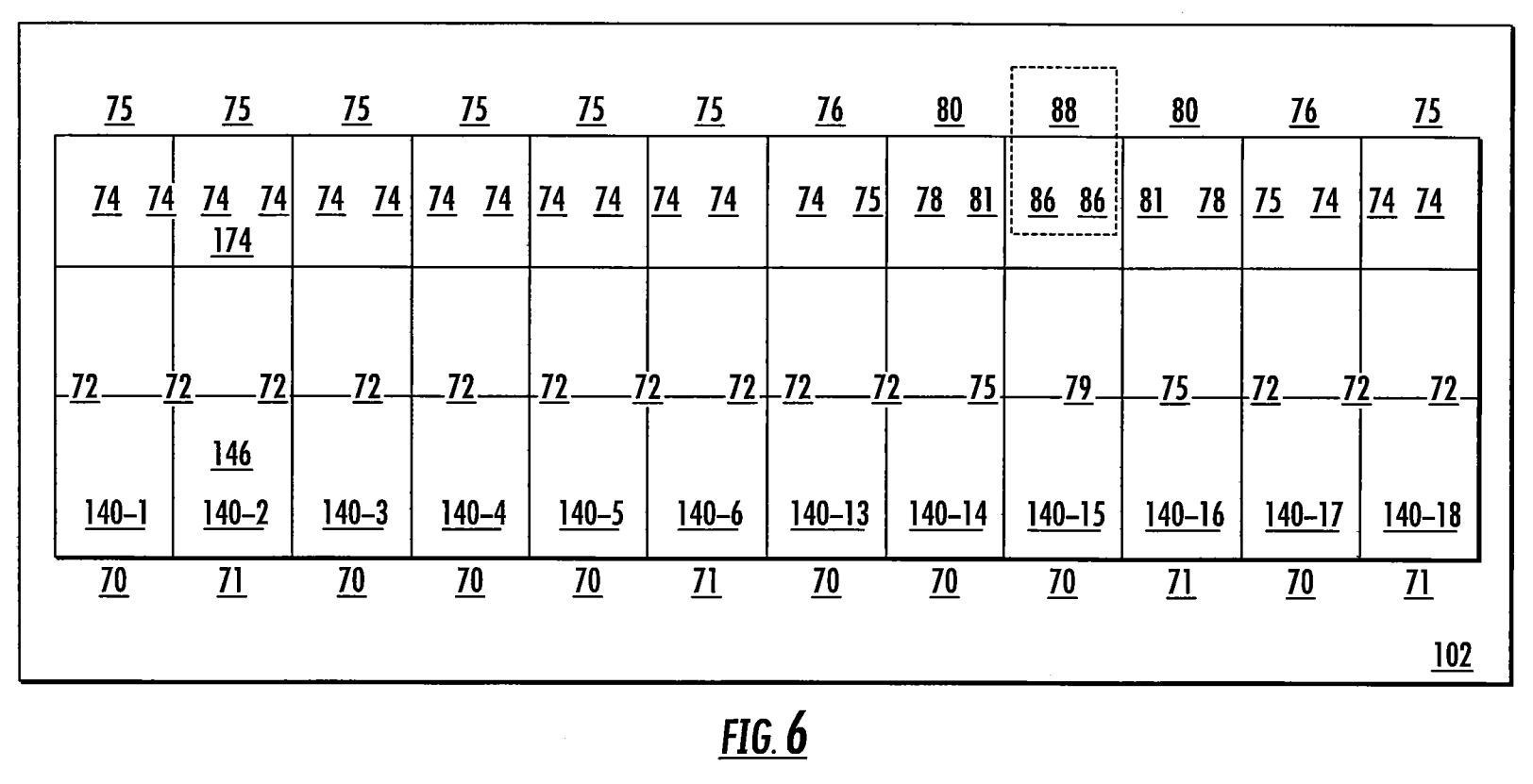

The data center temperature monitoring systems according to embodiments of the present invention may, in some embodiments, output two-dimensional or three-dimensional graphics (on a display, for print-out, etc.) in which the temperatures at various points along the equipment racks 140 are displayed. For example, FIG. 6 is an example of such a two-dimensional graphic 102 showing the temperatures at various points along the equipment racks 140 that are on one side of a cold aisle 150. As shown in FIG. 6, the depicted cold aisle 150 includes a total of twelve equipment racks 140 along the depicted side. While not shown, a plurality of items of electronic equipment 142 may be mounted in each equipment rack 140. For example, a typical equipment rack 140 might hold as many as 42 to 47 or more servers, which may be mounted in a plurality of vertically disposed slots. In FIG. 6, the individual servers 142 are not illustrated, but instead each equipment rack 140 is divided into two sections, namely a first section 144 that encompasses the upper third of each equipment rack 140 and a second section 146 that encompasses the lower two-thirds of each equipment rack 140. In FIG. 6, the top row of numbers illustrate the temperature readings on the top surface of the equipment racks 140 as measured by the infrared emission sensors 172 in the top row of sensors 181. These temperature values may be of interest because spill-over of hot air from a hot aisle 152 that is adjacent to cold aisle 150 may occur here. The temperatures below the equipment racks 140 indicate the temperature of the air entering through the perforated tiles in the floor 120. Note that FIG. 6 includes twelve equipment racks as opposed to the six equipment racks illustrated in FIGS. 2, 4 and 5. This is because FIG. 6 also includes the temperature readings from an adjacent infrared emission sensor 170 (not shown in FIGS. 2, 4 and 5) that is used to monitor the temperature readings along the aisle face and top surfaces of six additional equipment racks 140-13 through 140-18 (not shown in FIGS. 2, 4 and 5) that are adjacent to equipment racks 140-1 through 140-6 in FIGS. 2, 4 and 5.

As is further shown in FIG. 6, the temperature readings measured by the infrared emission sensors 172 of the infrared sensor array 170 may be displayed in the graphical output 102. Each temperature reading corresponds to a respective one of the field of view patterns 174 shown in FIG. 5. A user viewing the graphic 102 of FIG. 6 may readily scan a long row of equipment racks 140, view the temperatures at different areas on the racks 140, and identify areas of concern. As shown in FIG. 6, areas of concerns may be highlighted on the graphical output via, for example, different colors, fonts or other indicia.

In the example of FIG. 6, the user can conclude that there is a temperature concern at the top of equipment rack 140-15. The issue is isolated to a single equipment rack 140. As shown in FIG. 6, the temperature at the floor in front of equipment rack 140-15 is at an expected temperature level, which suggests that the air conditioning unit that is cooling equipment rack 140-15 is operating normally. However, the temperature at the top of equipment rack 140-15 is well above an expected value, which strongly suggests that hot air spillover is the cause of the temperature increase detected at equipment rack 140-15. Thus, it can be seen that the two-dimensional temperature maps provided by the temperature monitoring systems according to embodiments of the present invention may help to quickly isolate the cause of an unanticipated increase in temperature and hence may aid in quick resolution of such a problem. The user may also be interested in reviewing the historical data in a rapid time sequence to determine the underlying dynamics. This will help pinpoint how best to resolve the problem.

Figure 7:
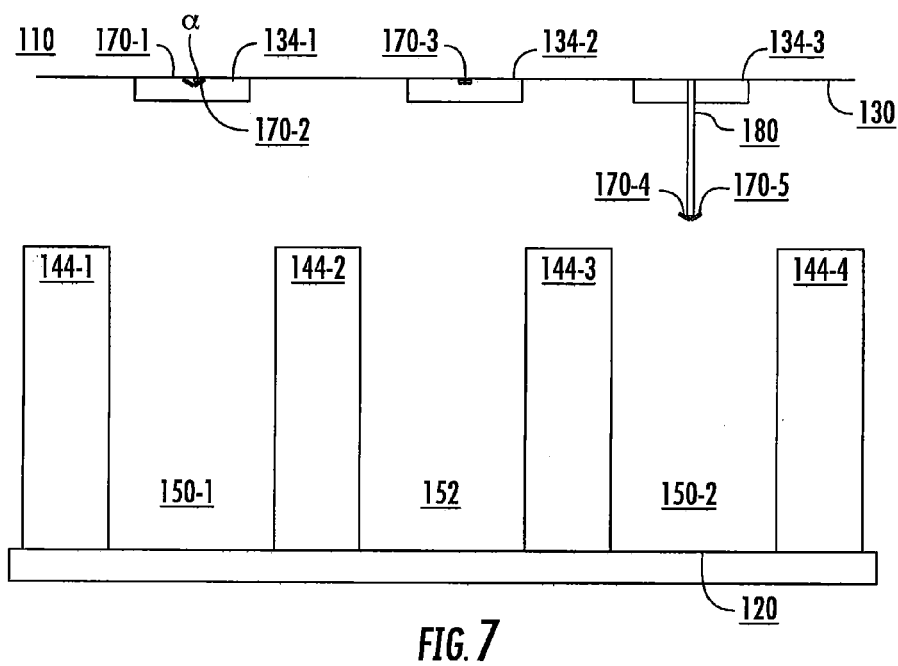
FIG. 7 is a schematic side view looking down several adjacent aisles in a data center that illustrates different mounting configurations for the infrared sensor arrays according to embodiments of the present invention.

FIG. 7 is a schematic side view looking down three aisles 150, 152 in the data center 110 that illustrates how the infrared sensor arrays 170 may be positioned in various embodiments of the present invention. The infrared sensor arrays 170 may be very small, but are shown somewhat enlarged as compared to a typical size for illustrative purposes. As shown in FIG. 7, in the leftmost aisle (aisle 150-1), a pair of infrared sensor arrays 170-1, 170-2 are co-located with the light fixture 134-1. The infrared sensor arrays 170-1, 170-2 are each angled to point toward the equipment racks 140 on respective sides of the aisle 150-1 as opposed to pointing straight down as is the case in the embodiment of FIG. 2 and FIGS. 4-6 that is discussed above. In particular, the substrate 176 of each infrared sensor array 170 is rotated so that the back side of the substrate 176 forms at an acute angle $\alpha$ with respect to a plane defined by the ceiling 130. Positioning the infrared sensor arrays 170-1, 170-2 at an angle as shown in FIG. 7 may help ensure that the infrared emission sensors 172 in each infrared sensor array 170 have field of view patterns 174 that provide good coverage of the aisle faces of the equipment racks 140. In the embodiment in FIG. 7, infrared sensor arrays 170-1, 170-2 may each be implemented, for example, as a 16×4 infrared sensor array 170 that has infrared emission sensors 172 with field of view patterns that correspond to the upper half (infrared sensor array 170-1) or the lower half (infrared sensor array 170-2) of FIG. 4. Angling the infrared sensor arrays 170 may also allow for use of a simpler lens structure (or no lens structure) on the infrared sensor arrays 170-1, 170-2 since it reduces the amount that it may be necessary to "steer" the field of view patterns 174 to desired locations along the aisle faces of the equipment racks 140.

Moreover, angling the infrared sensor arrays 170 may also provide the ability to fine-tune the exact alignment of the sensor grid for optimization. Although data centers are typically designed using computer aided design layout tools and good correlation is often present between the design plans and the "as built" results, some minor fine tuning may provide advantages. In addition, the exact dimensions of items such as equipment rack height and spacing between the top of the equipment racks 140 and the lighting fixtures 134 may not be consistent from one design to the next so fine tuning is a desirable attribute. Thus, if the infrared sensor arrays 170 are mounted at an angle $\alpha$, this angle $\alpha$ may be adjusted in the field, as necessary, to provide improved temperature monitoring performance.

Another optimization that can be implemented is to deploy a lensing system, such as a Fresnel lens to alter the field of view patterns 174 of the infrared emission sensors 172 to an angular area of interest. Combining this approach with mounting the infrared sensor arrays 170 at an angle $\alpha$, solutions can be developed where the grids in the grid array are optimally positioned for the greatest user benefit and the lowest cost.

As is further shown in FIG. 7, in the center aisle 152, which is a hot aisle, a single infrared sensor array 170-3 is provided that is not angled with respect to the ceiling 130 or the floor 120. The infrared sensor array 170-3 may be used to monitor the temperature of the equipment racks 140 on both sides of the aisle 152 in the manner discussed above with respect to FIGS. 4-6. Accordingly, additional discussion of the operation of infrared sensor array 170-3 will be omitted.

Finally, the rightmost aisle 150-2 in FIG. 7 shows yet another configuration, where a pair of infrared sensor arrays 170-4, 170-5 are mounted on a mounting structure 180 that extends downwardly from the ceiling 130 in the middle of the aisle 150-2. In the depicted embodiment, the mounting structure 180 is simply a hollow aluminum pipe that extends downwardly about two to three feet from the ceiling 170. It will be appreciated, however, that any appropriate mounting structure 180 may be used. The infrared sensor arrays 170-4, 170-5 are mounted at an angle $\alpha$ with respect to the ceiling 130 on either side of the mounting pipe 180 in a fashion similar to the angled mounting used for infrared sensor arrays 170-1 and 170-2. However, by lowering the height of the infrared sensor arrays 170-4, 170-5 with respect to the equipment racks 140, the field of view patterns 174 of the infrared emission sensors 172 will tend to spread significantly less because the infrared emission sensors 172 are closer to the aisle faces of the equipment racks 140. As a result, at least three infrared emission sensors 172 may have field of view patterns 174 that project onto the aisle faces of the equipment racks 140 at different vertical elevations above the floor 120, providing a greater amount of temperature information in the area that matters most, namely the locations of the air inflow ports on the servers and other electronic equipment 142. In such embodiments, the field of view patterns 174 may not be designed to provide coverage of the top surfaces of the equipment racks 140 in order to provide the finer coverage of the aisle faces of the equipment racks 140. Alternatively, infrared sensor arrays 170 having more rows of infrared emission sensors 172 may be employed so that a row of infrared emission sensors 172 may be provided that monitors the temperature along the top of the equipment racks 140.

Another potential advantage of the temperature monitoring systems according to embodiments of the present invention is that the infrared sensor arrays 170 can be co-located and integrated with the lighting system, if desired. For example, Redwood Systems currently offers a Building Performance Lighting System which includes sensors that detect motion, among other things, and communicate that information to a central controller. Direct current power is provided to power the lights, which may comprise light emitting diode ("LED") based light fixtures. The same cabling that is used to power the light fixtures is also used to transmit information from the motion sensor to the central controller and from the central controller to the motion sensor. One very cost-effective deployment technique is to integrate the infrared sensor arrays 170 used in embodiments of the present invention into an enhanced multi-function sensor that senses both temperature and motion. This results in a highly functional and cost-effective solution to a challenging problem. The multi-function infrared sensor arrays 170 can be co-located with the light fixtures 134 and can be powered by the same cabling used to power the light fixtures 134. Additionally, the power cable may also be used to carry temperature data from the infrared sensor array 170 to the centralized controller 160. As noted above, the Redwood Systems Building Management Solution is, already designed to transmit general information from sensors back to a central location as well as receive information from the central location. Transmitting incremental information is thus a simple low-cost and effective extension. As the use of solid state lighting (and particularly automatically controlled solid state lighting) may be cost-effective based on energy savings alone, the incremental cost of implementing the temperature monitoring system may be very small since the same sensors, electrical power cabling and communications cabling may be used for the temperature monitoring system that is already in place for the lighting system.

Figure 8:
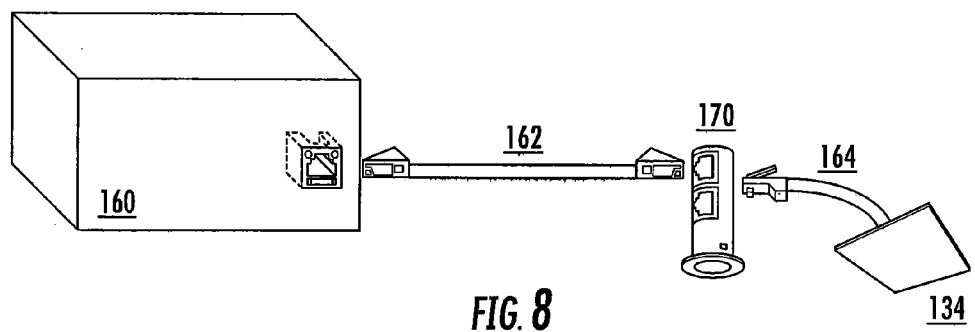
FIG. 8 is a schematic diagram illustrating how the infrared sensor arrays used in embodiments of the present invention may be integrated with a solid state lighting system.

FIG. 8 is a schematic diagram illustrating how the infrared sensor arrays 170 used in embodiments of the present invention may be integrated with a solid state lighting system.

As shown in FIG. 8, a plurality of infrared sensor arrays 170 may be mounted in a ceiling, generally adjacent to (or as part of) a light fixture 134 (infrared sensor arrays 170 that are generally adjacent to or part of a light fixture 134 may be referred to herein as being "co-located" with the light fixture 150). A cable 162 may electrically connect the infrared sensor array 170 to a controller 160. In the depicted embodiment, the cable 162 comprises an Ethernet patch cord having one or more twisted pairs of conductors, and the controller 160 includes an RJ-45 jack that the cable 162 plugs into. However, it will be appreciated that other types of cables may be used. It will also be appreciated that more than one cable 162 may be interposed between the infrared sensor array 170 and the controller 160, and that one or more connectors may be used to electrically connect such cables together.

The light fixture 134 may comprise, for example, a ceiling-mounted solid state light fixture such as a light emitting diode ("LED") based light fixture that includes a plurality of LEDs. The light fixture 134 may be powered, for example, by a direct current electrical signal that is transmitted to the light fixture 134 through the controller 160, the patch cord 162, the infrared sensor array 170, and another patch cord 164 that connects the light fixture 134 to the infrared sensor array 170. The infrared sensor array 170 may also be powered by this same direct current electrical signal. Thus, as both the infrared sensor array 170 and the light fixture 134 may be powered over a common cable 162, the cost of implementing the temperature monitoring systems according to embodiments of the present invention may be reduced. It will also be appreciated that in other embodiments a parallel connection may be used or that a serial connection may extend from the controller 160, to the light fixture 134 and then to the infrared sensor array 170.

Additionally, the infrared sensor array 170 may also be used to control the lighting. For example, as discussed in U.S. Pat. No. 8,159,156, the entire content of which is incorporated herein by reference as if set forth in its entirety, motion detectors or other sensors may be used to control light fixtures for various purposes such as energy conservation. Ceiling mounted motion detectors may be used, for example, to detect movement, and light fixtures that are within predetermined distances from the detected movement (or which are associated with the sensor) may be turned on, while other light fixtures which have associated sensors that do not detect any movement may be dimmed or turned off to conserve electricity. Pursuant to embodiments of the present invention, the infrared sensor arrays 170 may be used both to monitor the temperatures on the aisle faces of the equipment racks 140, and at the same time may also be used as motion detectors to detect movement that is used to control, for example, an illumination level of one or more light fixtures 134.

Moreover, data for controlling the light fixtures 134 and data transmissions between the infrared sensor arrays 170 and the controller 160 may be transmitted over the same cabling (e.g., cables 162 and/or 164) that is used to transmit the power signals to the infrared sensor array 170 and the light fixture 134. For example, U.S. Pat. Nos. 8,427,300 and 8,058,750, the entire contents of which are incorporated herein by reference as if set forth fully herein, disclose various methods of embedding uplink and downlink control/data signals onto a pair of wires that are used to electrically power sensors and light fixtures. In some embodiments of the present invention, the techniques disclosed in these patents may be used to transmit data from the infrared sensor arrays 170 to the controller 160. In some embodiments, the same cabling may be used to provide electrical power to both the infrared sensor array 170 and the light fixture 134 and to transmit data and control signals between the controller 160, the infrared sensor array 170 and/or the light fixture 134. In such embodiments, little or no additional cabling may be needed to implement the temperature monitoring system as the temperature monitoring system may use cabling that is installed for other purposes. This can greatly reduce the marginal costs associated with implementing the temperature monitoring system.

While in some embodiments the data may be transmitted between the infrared sensor arrays 170 and the centralized controller 160 over cabling connections, it will be, appreciated that in other embodiments wireless communications may be used. The exact wireless frequency band suitable for use may vary by country, and access from multiple devices may need to be negotiated. Wireless technology continues to evolve quickly so there is also risk that current wireless technology will not be compatible with new technology introduced in the future. For all these reasons, wired communications connections may be a preferred alternative in some embodiments, but wireless is nonetheless an option.

Embodiments of the present invention have been described above with reference to the accompanying drawings, in which embodiments of the invention are shown. It will be appreciated, however, that this invention may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc, may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, operations, elements and/or components, but do not preclude the presence or addition of one or more other features, operations, elements, components and/or groups thereof.

Note that in the claims appended hereto, various references may be made to "each" of a plurality of objects (e.g., sensors, sensor arrays, etc.). It will be understood that claim limitations that reference that each object has certain characteristics does not preclude the inclusion of additional objects that do not have the recited characteristic. By way of example, a claim to a temperature monitoring system that includes a plurality of infrared sensor arrays, where "each" of the sensor arrays includes a plurality of sensors, will cover a system that has at least two infrared sensor arrays that each have at least two sensors, regardless of whether or not the system also includes an infrared sensor array that only has a single sensor. Thus, the use of the word "each" in the claims that follow must be read in the context of the open-ended claims that follow that do not preclude the addition of further subject matter (e.g., an infrared sensor array with only one sensor in the example above) that is not positively recited in the claim.

All embodiments described above may be combined in any way to provide additional embodiments.

The foregoing disclosure is not intended to limit the present invention to the precise forms or particular fields of use disclosed. It is contemplated that various alternate embodiments and/or modifications to the present invention, whether explicitly described or implied herein, are possible in light of the disclosure.

That which is claimed is:

1. A temperature monitoring system for a data center that includes a plurality of aisles and a plurality of equipment racks that are mounted in rows between the aisles, the temperature monitoring system comprising:
    a plurality of overhead-mounted infrared sensor arrays that are mounted above the aisles and/or the equipment racks, wherein each infrared sensor array includes a two-dimensional array of infrared emission sensors, and at least some of the infrared emission sensors have field of view patterns that project onto aisle faces of the equipment racks; and
    a controller that is remote from at least some of the infrared sensor arrays and that is in communications with the infrared sensor arrays, the controller configured to provide a two-dimensional thermal map of the aisle faces of the equipment racks based at least in part on temperature data received from the infrared sensor arrays,
    wherein a first of the infrared sensor arrays comprises a substrate that has the plurality of infrared emission sensors on a front surface of the substrate, and wherein a back surface of the substrate is mounted at an acute angle with respect to a plane defined by the floor of the data center,
    wherein a first of the overhead-mounted infrared sensor arrays comprises a ceiling-mounted infrared sensor array that is mounted on a support that extends downwardly below the ceiling,
    wherein a first of the infrared sensor arrays is powered via a cable that includes at least first and second conductors, and wherein the information received from the first of the infrared sensor arrays is transmitted to the controller over at least one of the first and second conductors, and
    wherein the first and second conductors of the cable provide a direct current power signal to a light fixture.

2. The temperature monitoring system of claim 1, wherein the acute angle is an angle of at least twenty degrees.

3. The temperature monitoring system of claim 1, wherein the overhead-mounted infrared sensor arrays are co-located with light fixtures that are mounted above the aisles.

4. The temperature monitoring system of claim 3, wherein the controller is configured to control light emitted by the light fixtures based at least in part on motion detected by the overhead-mounted infrared sensor arrays.

5. The temperature monitoring system of claim 1, wherein the infrared sensor arrays comprise Grid Pattern Infrared sensor arrays that detect infrared emissions and convert the detected infrared emissions to temperature values.

6. The temperature monitoring system of claim 1, wherein the field of view pattern of the infrared emission sensors of a first of the overhead-mounted infrared sensor arrays have respective resolutions that vary at least as a function of a height of the field of view pattern above a floor of the data center.

7. The temperature monitoring system of claim 6, wherein the respective resolutions increase with increasing height of the field of view pattern above the floor.

8. The temperature monitoring system of claim 1, wherein a first infrared emission sensor of a first of the infrared sensor arrays has a field of view pattern that projects onto an upper portion of the aisle face of a first equipment rack, a second infrared emission sensor of the first of the infrared sensor arrays has a field of view pattern that projects onto a lower portion of the aisle face of the first equipment rack, and a third infrared emission sensor of the first of the infrared sensor arrays has a field of view pattern that projects onto a top surface of the first equipment rack.

9. The temperature monitoring system of claim 8, wherein a fourth infrared emission sensor of the first of the infrared sensor arrays has a field of view pattern that projects onto a floor of the data center.

10. A temperature monitoring system for a data center that includes a plurality of aisles and a plurality of equipment that are mounted in rows between the aisles, the temperature monitoring system comprising:
    a plurality of overhead-mounted infrared sensor arrays that are mounted above the aisles and/or the equipment racks, wherein each infrared sensor array includes a two-dimensional array of infrared emission sensors, and at least some of the infrared emission sensors have field of view patterns that project onto aisle faces of the equipment racks; and
    a controller that is remote from at least some of the infrared sensor arrays and that is in communications with the infrared sensor arrays, the controller configured to provide a two-dimensional thermal map of the aisle faces of the equipment racks based at least in part on temperature data received from the infrared sensor arrays,
    wherein a first infrared emission sensor of a first of the infrared sensor arrays has a field of view pattern that projects onto an upper portion of the aisle face of a first equipment rack and a second infrared emission sensor of the first of the infrared sensor arrays has a field of view pattern that projects onto a lower portion of the aisle face of the first equipment rack, and
    wherein a third infrared emission sensor of the first of the infrared sensor arrays has a field of view pattern that projects onto a top surface of the first equipment rack.

11. The temperature monitoring system of claim 10, wherein a fourth infrared emission sensor of the first of the infrared sensor arrays has a field of view pattern that projects onto a floor of the data center.

12. The temperature monitoring system of claim 11, wherein the first through fourth infrared emission sensors have field of view patterns that are aligned along an axis.

13. The temperature monitoring system of claim 10, wherein the field of view pattern of the infrared emission sensors of a first of the overhead-mounted infrared sensor arrays have respective resolutions that vary at least as a function of a height of the field of view pattern above a floor of the data center.

14. The temperature monitoring system of claim 13, wherein the respective resolutions increase with increasing height of the field of view pattern above the floor.

15. The temperature monitoring system of claim 10, wherein the infrared sensor arrays comprise Grid Pattern Infrared sensor arrays that detect infrared emissions and convert the detected infrared emissions to temperature values.

16. A temperature monitoring system for a data center that includes a plurality of aisles and a plurality of equipment racks that are mounted in rows between the aisles, the temperature monitoring system comprising:
   a plurality of overhead-mounted infrared sensor arrays that are mounted above the aisles and/or the equipment racks, wherein each infrared sensor array includes a two-dimensional array of infrared emission sensors, and at least some of the infrared emission sensors have field of view patterns that project onto aisle faces of the equipment racks; and
   a controller that is remote from at least some of the infrared sensor arrays and that is in communications with the infrared sensor arrays, the controller configured to provide a two-dimensional thermal map of the aisle faces of the equipment racks based at least in part on temperature data received from the infrared sensor arrays,
   wherein the field of view pattern of the infrared emission sensors of a first of the overhead-mounted infrared sensor arrays have respective resolutions that vary at least as a function of a height of the field of view pattern above a floor of the data center.

17. The temperature monitoring system of claim 16, wherein the respective resolutions increase with increasing height of the field of view pattern above the floor.

18. The temperature monitoring system of claim 16, wherein the infrared sensor arrays comprise grid Pattern Infrared sensor arrays that detect infrared emissions and convert the detected infrared emissions to temperature values.

* * * * *